(12) United States Patent
Mailloux et al.

(10) Patent No.: US 6,564,165 B1
(45) Date of Patent: May 13, 2003

(54) APPARATUS AND METHOD FOR INLINE TESTING OF ELECTRICAL COMPONENTS

(75) Inventors: James J. Mailloux, Terra Haute, IN (US); Brian S. Marts, Marshall, IL (US)

(73) Assignee: TRW Inc., Lyndhurst, OH (US)

( * ) Notice: Subject to any disclaimer, the term of this patent is extended or adjusted under 35 U.S.C. 154(b) by 0 days.

(21) Appl. No.: 09/470,714

(22) Filed: Dec. 22, 1999

(51) Int. Cl.[7] .............................................. G01N 29/04
(52) U.S. Cl. ....................... 702/136; 374/57; 73/865.6
(58) Field of Search ................................. 702/116, 118, 702/121, 130, 132, 136; 324/760, 763, 755, 765, 555, 73.1; 374/50, 57, 45; 73/865.6, 865.9; 228/104

(56) References Cited

U.S. PATENT DOCUMENTS

| 4,729,246 A | * | 3/1988 | Melgaard et al. | ............ 73/865.6 |
| 4,871,965 A | | 10/1989 | Elbert et al. | |
| 4,967,155 A | * | 10/1990 | Magnuson | ................... 324/212 |
| 5,267,467 A | * | 12/1993 | Caron | ............................... 73/3 |
| 5,431,491 A | * | 7/1995 | Melgaard et al. | ......... 312/232.1 |
| 5,451,884 A | * | 9/1995 | Sauerland | .................... 324/760 |
| 5,516,028 A | * | 5/1996 | Rasp et al. | ................... 228/104 |
| 5,545,759 A | | 8/1996 | Ikeda et al. | ..................... 568/6 |
| 5,602,761 A | * | 2/1997 | Spoerre et al. | .............. 364/554 |
| 5,613,776 A | * | 3/1997 | Turner et al. | .................. 374/57 |
| 5,675,098 A | * | 10/1997 | Hobbs | ........................ 73/865.6 |
| 5,929,340 A | * | 7/1999 | Cochran et al. | ............... 73/766 |
| 6,104,183 A | * | 8/2000 | Kobayashi et al. | ....... 324/158.1 |
| 6,204,679 B1 | * | 3/2001 | Gray, III | ...................... 324/760 |
| 6,313,652 B1 | * | 11/2001 | Maeng | ........................ 324/760 |

FOREIGN PATENT DOCUMENTS

| JP | 62-204173 | 9/1987 |
| JP | 22-26076 | 9/1990 |
| JP | 9-197000 | 7/1997 |

OTHER PUBLICATIONS

Rasp and Gavin article entitled "Tunnel Systems Emerge as New ESS Strategy".

* cited by examiner

Primary Examiner—Marc S. Hoff
Assistant Examiner—Paul Kim
(74) Attorney, Agent, or Firm—Tarolli, Sundheim, Covell & Tummino L.L.P.

(57) ABSTRACT

An apparatus (10) for inline testing of a product (15) includes an environmental chamber (20), a conveyor (40), a stimulation means (60), and a monitoring means (80). The environmental chamber (20) provides thermal shock to the product (15) and includes a hot zone (22) and a cold zone (24). The conveyor (40) transports the product (15) through the hot (22) and cold zones (24) of the environmental chamber (20). The stimulation means (60) provides continuous electric stimulation to the product (15) during transport of the product (15) through the environmental chamber (20). The monitoring means (80) continuously monitors the effect of the stimulation means (60) on the product (15) during transport of the product (15) through the environmental chamber (20).

24 Claims, 2 Drawing Sheets

APPARATUS AND METHOD FOR INLINE
TESTING OF ELECTRICAL COMPONENTS

TECHNICAL FIELD

The present invention relates to the testing of electrical components, and more particularly, relates to thermal shock testing of electrical components.

DESCRIPTION OF THE PRIOR ART

Electrical components are commonly tested at high and low temperatures to identify which components would not operate effectively at high and low temperatures. A conventional testing procedure is a batch process. In a batch process a number of electrical components are simultaneously heated and cooled as a group and monitored as a group.

Also, an in-line testing process is known. In an in-line process, the electrical components are moved sequentially through a tunnel having a cold chamber portion and a hot chamber portion. The electrical components are monitored as they move sequentially through the tunnel. The monitoring determines which components are not operative through a temperature range, in which the components are intended to operate, and thus, the monitoring determines which components are defective.

In an in-line process a conveyor system transports electronic components through discrete electrical test stations in spaced apart hot and cold zones. The components are electrically tested at the electrical test stations at predetermined locations in the hot and cold zones.

SUMMARY OF THE INVENTION

An apparatus for inline thermal testing of an electrical component includes an environmental chamber, a conveyor, a stimulation means, and a monitoring means. The environmental chamber includes a hot zone and a cold zone. The conveyor transports the electrical component through the hot and cold zones of the environmental chamber. The stimulation means provides continuous electric stimulation to the electrical component during transport of the electrical component through the environmental chamber. The monitoring means continuously monitors the effect of the stimulation means on the electrical component during transport of the electrical component through the environmental chamber.

BRIEF DESCRIPTION OF THE DRAWINGS

The foregoing and other features of the present invention will become apparent to those skilled in the art to which the present invention relates upon reading the following description with reference to the accompanying drawings, wherein.

DESCRIPTION OF A PREFERRED EMBODIMENT

Figure 1:
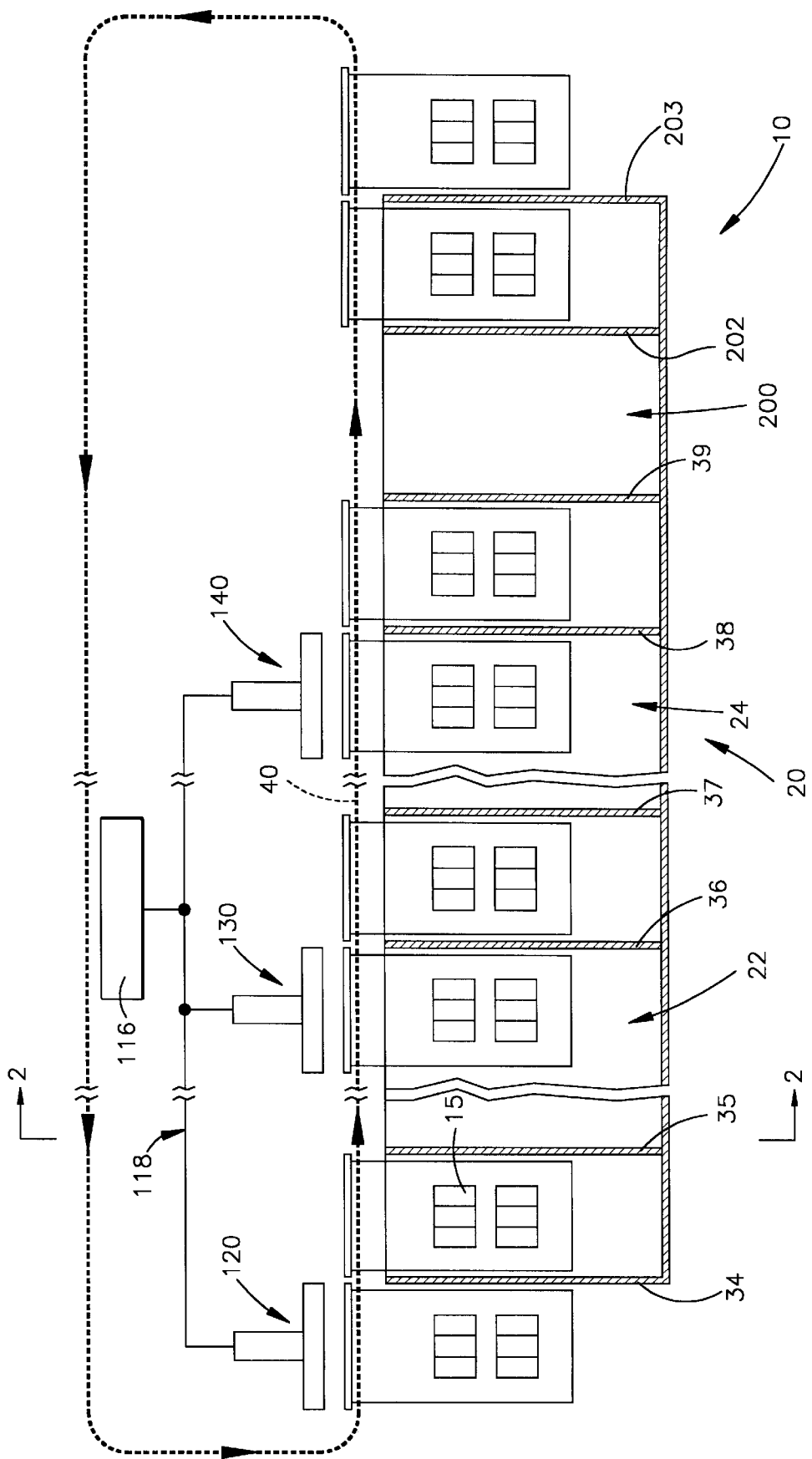
FIG. 1 is a schematic view of an apparatus embodying the present invention.
Figure 2:
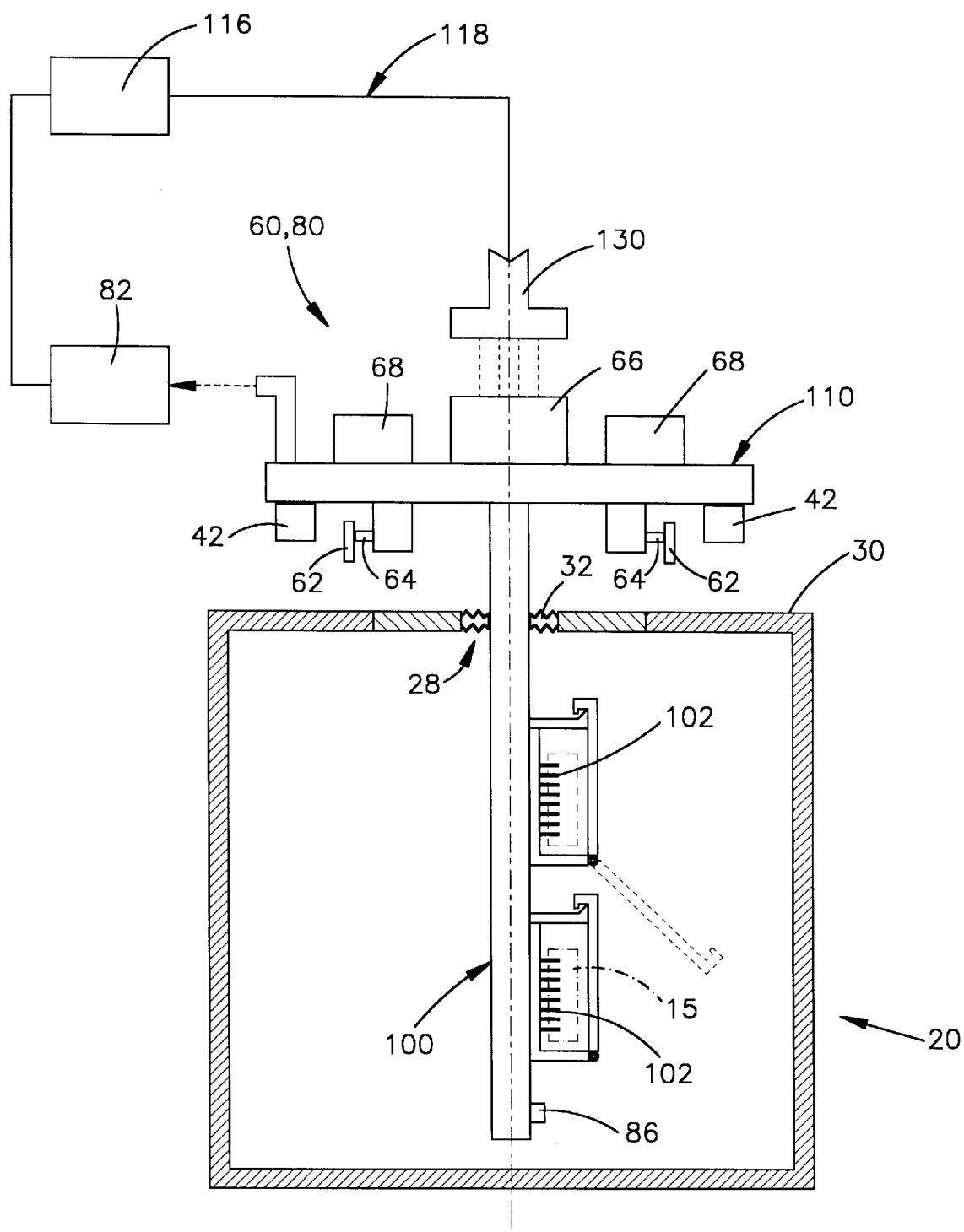
FIG. 2 is a schematic sectional view along line 2—2 in FIG. 1.

As representative of the present invention, FIG. 1 illustrates an apparatus 10 for inline testing of a product 15. The product 15 may be an electronic control module, a CPU, a power steering electronic control module, an air bag module dual stage control circuit, an open circuit board, etc. The apparatus 10 includes an environmental chamber 20, a conveyor 40, a stimulation means 60 (FIG. 2), and a continuous monitoring means 80 (FIG. 2).

The environment chamber 20 is a box-like enclosure through which the products 15 are sequentially moved by the conveyor 40. The environmental chamber has an entrance door 34 which is movable to an open position to enable products 15 to enter the chamber 20 and a closed position to enclose the products 15 within the chamber 20.

The environmental chamber 20 is about 40 feet long but may be a different length depending on the product being tested. The environmental chamber 20 includes a hot zone 22 and a cold zone 24. The hot zone 22 typically ranges in temperature from 85° C. to 125° C. The cold zone 24 is typically −40° C. The temperature of the hot zone 22 and cold zone 24 can vary depending upon design criteria of the products 15.

The products 15 are mounted on a fixture 100 prior to being conveyed through the chamber 20. The fixture is connected to a pallet 110. The fixture 100 and pallet 110 are hard wired together and plug into each other. The pallet 110 is conveyed outside the chamber by the conveyor 40 while the fixture 100 is moved through the chamber 20. The pallet 110 and fixture 100 have a length as measured in the direction of conveyor travel of about 18 inches, but this length could be some other dimension.

The environmental chamber 20 has an elongate slot 28 (FIG. 2) in its upper surface 30 for allowing the fixture 100 to extend into and travel through the environmental chamber 20 and still be in contact with, and hard-wired to, the pallet 110 located above the environmental chamber 20. The slot 28 may have a flexible, elastomeric material 32 lining the slot 28 for thermally resisting heat transfer around the fixture 100. The pallet 110 and fixture 100 form a T-shaped structure (FIG. 2) with the fixture 100 forming the lower, vertical part of the "T" and extending down through the slot 28 and into the environmental chamber 20.

Typically, six electronic components are attached to the fixture 100 at any one time for simultaneous testing of each component which are the products 15 being tested.

The conveyor 40, located above the environmental chamber 20, transports the products 15 through the hot 22 and cold 24 zones of the environmental chamber 20. The conveyor 40 includes two belts 42 (FIG. 2) on which the pallet 110 rests. The two belts 42 travel above the environmental chamber 20 and frictionally engage the pallet 110, thereby moving the pallet 110 along the upper surface 30 above the environmental chamber 20.

The conveyor 40 moves in incremental steps (typically 20 inches) at predetermined time intervals (typically 90 seconds). Thus, the conveyor 40 moves, and then is stationary for a time interval (90 seconds), and then moves again. This incremental movement of the conveyor 40 allows a plurality of pallets/fixtures 100, 110 (typically 18 inches in length) to be spaced apart by the 20 inch incremental steps and to travel through the environmental chamber 20 simultaneously, but at different stages of the overall test process, as shown in FIG. 1.

The stimulation means 60 provides continuous cyclic electric stimulation of the products 15 during transport of the products 15 through the environmental chamber 20. Two buss bars 62 are located between the two belts 42 of the conveyor 40 and provide electronic power to the pallet 110 through spring loaded brushes 64 located on the pallet 110.

Typically multiple brushes are connected in parallel. This configuration maintains a constant power supply to the pallet 110, even when one or more connections at the buss bar/brush interfaces are temporarily broken by the sliding of the spring loaded brushes 64 against the buss bars 62.

A master microprocessor 66 and a plurality of slave microprocessors 68 (typically one for each product 15) are located on the pallet 110. Each slave microprocessor 68 controls the testing, or stimulating, of each product 15. The master microprocessor 66 controls the operation and functioning of the slave microprocessors 68. The location of the master 66 and slave 68 microprocessors above the environmental chamber 20 on the pallet 110 allows them to remain at ambient temperature throughout the test process, thereby maximizing their functional lives.

The monitoring means 80 continuously monitors the effect of the stimulation means 60 on the products 15 during transport of the products 15 through the environmental chamber 20 and throughout the temperature transitions incurred by the products 15. The monitoring means 80 includes the master microprocessor 66, infrared links 82, and a plurality of test heads 120, 130, 140 which periodically engage an interface assembly (not shown) on the pallet 110 and perform additional data collection and testing.

The master microprocessor 66 continuously records performance data of each product 15 (i.e., pass/fail) during their travel through the environmental chamber 20 in its memory. Some components fail at extreme temperatures and then "heal" as the temperature of the component is returned from that extreme temperature. After this healing, the component appears fully functional in all respects. However, the component has a much shorter functional life. Consequently, the continuous monitoring by the master microprocessor 66 allows detection of this type of failure before "healing" can occur.

Additionally, mechanical connection failures, or fixturing failures, may occur during temperature transitions as each product 15 travels through the environmental chamber 20. In this type of failure, parts of the products 15 may become detached and then reattached. These "intermittent" failures are largely independent of extreme temperature and mainly occur during temperature transitions due to various temperature gradients incurred by the products 15. The continuous monitoring by the master microprocessor 66 allows detection of this type of failure before reattachment can occur.

An indexing means 86, such as a silicon chip with a temperature transducer, is located on the fixture 100 for communicating to the master microprocessor 66 the location and temperature at which these failures occur. This data can be useful in determining why a defect occurred and how to correct the manufacturing or assembly process which created the defect.

The infrared links 82 are located at intervals along the upper surface 30 of the environmental chamber 20 for communicating pass/fail and other data from the pallet 110 to a central monitoring point 116, such as a computer terminal.

Typically three test heads 120, 130, 140 are utilized for a more extensive statistical analysis of the performance of the products 15 during their travel through the environmental chamber 20.

After loading products 15 onto the fixture 100, a first head 120, or pretest head, is lowered into engagement with the master microprocessor 66 before the fixture 100 enters the environmental chamber 20, as shown in FIG. 1. This pretest step determines the parameters at various critical locations, known as test nodes, on each product 15. The initial ambient status of each node on each product 15 is determined and that data is transferred to the central monitoring point 116 through the master microprocessor 66, the first head 120, and a data highway 118. Initial failures may be detected here.

Typically, 12–15 test nodes are monitored on each product 15. The fixture 100 engages each node on each product 15 with test pins 102 located on the fixture 100. These connections are maintained at these test nodes from this loading point until the entire test is concluded, the products 15 exit the environmental chamber 20, and the products 15 are unloaded. However, the majority of these connections are only utilized when a test head 120, 130, or 140 is lowered and engages the master microprocessor 66 on the pallet 110. Otherwise, only the performance of the products 15 as a whole are monitored by the master microprocessor 66.

After the pretest step is concluded, the first head 120 is raised, a first entrance door 34 is opened, and the conveyor 40 transports the pallet 110 one incremental step above the environmental chamber 20 and the fixture 100 the same one incremental step into the environmental chamber 20. The first entrance door 34 closes and the fixture 100 remains between the first entrance door 34 and a second entrance door 35 for the predetermined time interval.

Then, the second entrance door 35 opens, the pallet/fixture 100, 110 travels one incremental step, and the fixture 100 enters the hot zone 22 with the second entrance door 35 closing behind it.

During the following incremental steps (typically 9) within the hot zone 22, the temperature of the products 15 stabilizes to the temperature of the hot zone 22. The master microprocessor 66 continuously monitors the performance of the products 15 during this temperature transition and stabilization.

During the last incremental step in the hot zone 22, a second head 130 is lowered to engage the master microprocessor 66. The second head 130 monitors and stores the parameters at the test nodes on each product 15 during this time. A statistical analysis is conducted based on these parameters. This analysis detects precursors to infant mortality of the products 15 caused by extreme high temperatures, even though the products 15 have not experienced a total failure at any one node.

Specifically, fluctuations of current (or resistance) at a particular test node during repeated power cycles to a product 15 under thermal stress, known as "parametric shifts", have been known to occur prior to a total failure at that test node. Detecting the occurrence of these parametric shifts at the various test nodes, and utilizing that data with the laws of probability and statistics, allows the prediction of unacceptable future failures and the screening out of a very large percentage of future failures without actually causing the failures to occur. This saves much valuable production time and reduces the time lag in correcting errors in assembly and production. The analysis may be conducted by the computer terminal at the central monitoring point 116, just as in the pretest step above.

After this analysis is conducted (one predetermined time interval), the second head 130 is raised, a first intermediate door 36 opens, the pallet/fixture 100, 110 advances one incremental step, and the first intermediate door 36 closes. The fixture 100 remains between the first intermediate door 36 and a second intermediate door 37 for one predetermined time interval. During this time, the products 15 begin to cool as the temperature between the first 36 and second 37 intermediate doors fluctuates in the range between the temperature of the hot zone 22 and the temperature of the cold zone 24 (due to the opening and closing of the first 36 and second 37 intermediate doors). The master microprocessor 66 continuously monitors the performance of the products 15 during this temperature transition period.

Then, the second intermediate door 37 opens, the pallet/fixture 100, 110 advances one incremental step into the cold zone 24, and the second intermediate door 37 closes.

During the following incremental steps (typically 9) within the cold zone 24, the temperature of the products 15 stabilizes to the temperature of the cold zone 24. The master microprocessor 66 continuously monitors the performance of the products 15 during this temperature transition and stabilization.

During the last incremental step in the cold zone 24, a third head 140 is lowered to engage the master microprocessor 66. The third head 140 monitors and stores the parameters at the test nodes on each product 15 during this time. The same parametric statistical analysis is conducted, just as in the hot zone 22 above. This analysis detects precursors to infant mortality of the products 15 caused by extreme low temperatures, even though the components have not experienced a total failure at any one node, as above in the hot zone analysis.

After this analysis is conducted (one predetermined time interval), the third head 140 is raised, a third intermediate door 38 opens, the pallet/fixture 100, 110 advances one incremental step, and the third intermediate door 38 closes. The fixture 100 remains between the third intermediate door 38 and a fourth intermediate door 39 for one predetermined time interval.

Then, the fourth intermediate door 39 opens, the fixture 100 advances one incremental step into a warm-up zone 200, and the fourth intermediate door 39 closes.

During the following incremental steps (typically 9) within the warm-up zone 200, the temperature of the products 15 stabilizes to ambient temperature. After the last incremental step in the warm-up zone 200, a first exit door 202 opens, the pallet/fixture 100, 110 advances one incremental step, and the first exit door 202 closes. The fixture 100 remains between the first exit door 202 and a second exit door 203 for one predetermined time interval.

Then, the second exit door 203 opens, the fixture 100 advances one incremental step out of the warm-up zone 200, and the second exit door 203 closes. The products 15 may now be disconnected and unloaded from the fixture 100 and routed appropriately, as determined by the above analyses.

Additionally, the master microprocessor 66 may continuously monitor 3–4 test nodes during the travel of each product 15 through the environmental chamber 20. A more limited parametric statistical analysis may be conducted at intervals (typically 90 seconds) during the travel of each product 15 through the environmental chamber 20. This additional analysis detects parametric shifts which only occur during temperature transitions, not at stabilized temperatures such as the locations where the more extensive parametric statistical analysis is conducted by the test heads 130, 140.

The above inline testing may be conducted in conjunction with a Computer Integrated Manufacturing (CIM) program. Using the real time feedback available by this testing apparatus/method, virtually immediate correction of manufacturing and assembly errors can be realized. The waste incurred by the production of a multitude of defect components, caused by the time lag for discovery of the origins of the defect, can be greatly reduced by the apparatus/method of the present invention.

From the above description of the invention, those skilled in the art will perceive improvements, changes and modifications. Such improvements, changes and modifications within the skill of the art are intended to be covered by the appended claims.

Having described the invention, the following is claimed:

1. An apparatus for inline testing of a product, said apparatus comprising:
    an environmental chamber for providing thermal shock to the product, said environmental chamber including a hot zone and a cold zone;
    a conveyor for transporting the product through said hot and cold zones of said environmental chamber;
    a means for continuous electric stimulation of the product during transport of the product through said environmental chamber; and
    a means for continuously monitoring the effect of said stimulation means on the product during transport of the product through said hot zone, an intermediate zone, and said cold zone of said environmental chamber.

2. The apparatus as defined in claim 1 further including one master microprocessor for storing parametric data generated by said monitoring means.

3. The apparatus as defined in claim 2 further including a plurality of slave microprocessors for communicating with a plurality of test products.

4. The apparatus as defined in claim 1 wherein said stimulation means stimulates the product in cycles.

5. The apparatus as defined in claim 1 further including a pallet for supporting a fixture, a buss bar, and a brush for providing continuous electrical contact between said pallet and said buss bar during transport of said fixture through said environmental chamber.

6. The apparatus as defined in claim 5 wherein said pallet and said fixture form a T-shaped structure, said fixture extending into said environmental chamber and said pallet remaining exterior to said environmental chamber.

7. The apparatus as defined in claim 5 further including a plurality of retractable test heads which communicate with said pallet during transport of the product through said environmental chamber.

8. The apparatus as defined in claim 1 further including a warm-up chamber for allowing the product to stabilize at ambient temperature.

9. The apparatus as defined in claim 1 further including a means for statistically analyzing data obtained from said monitoring means, said data including parametric shifts.

10. The apparatus as defined in claim 9 wherein said analyzing means includes a plurality of retractable test heads for providing a hardwire connection to said monitoring means.

11. The apparatus as defined in claim 1 further including an indexing means for communicating the location of the product in said environmental chamber and the temperature at which a failure of the product occurs to said monitoring means.

12. The apparatus as defined in claim 1 further including infrared links for communicating pass/fail data to said monitoring means.

13. A method for inline testing of a product, said method comprising the steps of:
    transporting the product to a hot zone;
    maintaining the product in said hot zone for a predetermined duration;
    transporting the product from said hot zone to a cold zone;
    maintaining the product in said cold zone for a predetermined duration;
    transporting the product from said cold zone to an ambient zone;
    electrically stimulating the product continuously during all of said transporting and maintaining steps;

continuously monitoring the effect of said stimulating step on the product during all of said transporting and maintaining steps through the hot, cold, and ambient zones; and statistically analyzing data generated by said monitoring step for determining precursors to infant mortality of the product, said data including parametric shifts.

14. The method as defined in claim 13 further including the step of storing data generated by said monitoring step for use in said analyzing step.

15. The method as defined in claim 13 wherein said transporting steps are performed in increments of predetermined length.

16. The method as defined in claim 15 wherein said increments occur at predetermined time intervals.

17. The method as defined in claim 13 wherein said monitoring step includes storing data generated from a plurality of nodes located on the product.

18. The method as defined in claim 13 wherein said stimulating step includes cyclic stimulation of the product.

19. The method as defined in claim 13 wherein said analyzing step includes a first parametric test step conducted while the product is located in said hot zone.

20. The method as defined in claim 19 wherein said analyzing step includes a second parametric test step conducted while the product is located in said cold zone.

21. The method as defined in claim 20, wherein said analyzing step includes an initial test step for determining the ambient status of the product.

22. The method as defined in claim 13 wherein said monitoring step includes monitoring the product in a transition zone located intermediate said hot and cold zones.

23. The method as defined in claim 13 wherein said analyzing step includes detecting current fluctuations that only occur during temperature transitions within the environmental chamber.

24. An apparatus for testing an electrical product, said apparatus comprising:

an environmental chamber for providing thermal shock to the electrical product, said environmental chamber including a hot zone, a cold zone, and a transition zone between said hot zone and said cold zone;

a single conveyor extending through said hot zone, said transition zone, and said cold zone, said single conveyor transporting the electrical product through said hot zone, said transition zone, and said cold zone of said environmental chamber;

a means for continuous electric stimulation of the electrical product during transport of the electrical product through said environmental chamber; and a means for continuously monitoring the effect of said stimulation means on the electrical product during transport of the electrical product through said hot zone, said transition zone, and said cold zone.

* * * * *